United States Patent
Higgins, III et al.

(10) Patent No.: US 10,446,476 B2
(45) Date of Patent: Oct. 15, 2019

(54) PACKAGED INTEGRATED CIRCUIT HAVING STACKED DIE AND METHOD FOR THEREFOR

(71) Applicant: NXP USA, INC., Austin, TX (US)

(72) Inventors: Leo M. Higgins, III, Austin, TX (US); Fred T. Brauchler, Canton, MI (US); Burton Jesse Carpenter, Austin, TX (US); Jinmei Liu, Tianjin (CN); Mariano Layson Ching, Jr., Tianjin (CN); Jinzhong Yao, Tianjin (CN); Xingshou Pang, Tianjin (CN); Jianhong Wang, Tianjin (CN); Yadong Wei, Tianijn (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/925,022

(22) Filed: Mar. 19, 2018

(65) Prior Publication Data
US 2019/0088576 A1    Mar. 21, 2019

(30) Foreign Application Priority Data

Sep. 19, 2017 (CN) .......................... 2017 1 0847527

(51) Int. Cl.
*H01L 23/495* (2006.01)
*H01L 23/538* (2006.01)
*H01L 23/64* (2006.01)
*H01L 23/00* (2006.01)
(Continued)

(52) U.S. Cl.
CPC .... *H01L 23/49575* (2013.01); *H01L 23/5389* (2013.01); *H01L 23/645* (2013.01); *H01L 24/42* (2013.01); *H01L 2224/04042* (2013.01); *H01L 2224/32145* (2013.01); *H01L 2224/48* (2013.01); *H01L 2225/0651* (2013.01); *H01L 2924/14* (2013.01); *H01L 2924/15311* (2013.01); *H01L 2924/30107* (2013.01); *H04L 25/0266* (2013.01)

(58) Field of Classification Search
None
See application file for complete search history.

(56) References Cited

U.S. PATENT DOCUMENTS 7,892,858 B2    2/2011  Liu et al.
7,932,590 B2 *  4/2011  Lam ..................... H01L 23/645
                                                    257/531
(Continued)

OTHER PUBLICATIONS

Avago Technologies, "Stacked LED Technology Enables Highly Integrated Optocouplers," White Paper AV02-2402EN, www.avagotech.com, Published: Mar. 20, 2010; Downloaded from Internet on Dec. 13, 2017.
(Continued)

*Primary Examiner* — Telly D Green (57) ABSTRACT

A packaged integrated circuit (IC) device includes a first IC die with a first inductor, a first layer of adhesive on a first major surface of the first IC die, an isolation layer over the first layer of adhesive, a second layer of adhesive on the isolation layer, a second IC die on the second layer of adhesive, and a second inductor in the second IC die aligned to communicate with the first inductor. The isolation layer extends a prespecified distance beyond a first edge of the second IC die.

17 Claims, 5 Drawing Sheets

10

(51) Int. Cl.
*H04L 25/02* (2006.01)
*H01L 23/522* (2006.01)

(56) References Cited

U.S. PATENT DOCUMENTS

| | | | | |
|---|---|---|---|---|
| 8,258,599 | B2* | 9/2012 | Lam | H01L 23/3107 |
| | | | | 257/531 |
| 8,364,195 | B2 | 1/2013 | Spina et al. | |
| 9,035,422 | B2 | 5/2015 | Khanolkar et al. | |
| 9,111,772 | B1 | 8/2015 | Strutz et al. | |
| 9,219,028 | B1 | 12/2015 | Higgins, III et al. | |
| 9,269,694 | B2* | 2/2016 | Chen | H01L 23/3672 |
| 10,062,665 | B2* | 8/2018 | Chen | H01L 25/0655 |
| 2006/0040177 | A1* | 2/2006 | Onodera | H01G 9/08 |
| | | | | 429/174 |
| 2007/0138572 | A1* | 6/2007 | Lam | H01L 23/3107 |
| | | | | 257/379 |
| 2007/0138628 | A1* | 6/2007 | Lam | H01L 25/0652 |
| | | | | 257/723 |
| 2009/0243782 | A1 | 10/2009 | Fouquet et al. | |
| 2013/0154081 | A1* | 6/2013 | Kadoguchi | H01L 23/36 |
| | | | | 257/712 |
| 2013/0154084 | A1* | 6/2013 | Kadoguchi | H01L 23/3121 |
| | | | | 257/717 |
| 2015/0001948 | A1* | 1/2015 | Brauchler | H01F 19/08 |
| | | | | 307/104 |
| 2015/0162307 | A1* | 6/2015 | Chen | H01L 23/3672 |
| | | | | 257/712 |
| 2017/0162542 | A1* | 6/2017 | Chen | H01L 23/3672 |

OTHER PUBLICATIONS

Avago Technologies, "Avago Regulatory Guide to Isolation Circuits" White Paper AV02-2041EN, www.avagotech.com, Published: Sep. 15, 2011.

Uchida, Shinichi, et al., "A Face-to-Face Chip Stacking 7kV RMS Digital Isolator for Automotive and Industrial Motor Drive Applications," (pp. 442-445), Proceedings of the 26th International Symposium on Power Semiconductor Devices & IC's, Jun. 15-19, 2014, Waikoloa, Hawaii, DOI: 10.1109/ISPSD.2014.6856071.

* cited by examiner

PACKAGED INTEGRATED CIRCUIT HAVING STACKED DIE AND METHOD FOR THEREFOR

CROSS-REFERENCE TO RELATED APPLICATIONS

This application claims the priority under 35 U.S.C. § 119 of China application no. 201710847527.1, filed on 19 Sep. 2017, the contents of which are incorporated by reference herein.

BACKGROUND

Field

This disclosure relates generally to integrated circuit packaging, and more specifically, to a packed integrated circuit having stacked die.

Related Art

Communication between integrated circuit (IC) die can be achieved using inductive coupling in which two die can use transmitting and receiving inductors to communicate. In such applications, electrical (or galvanic) isolation is desired between the die. "Galvanic isolation" means that there is no metallic or DC electrically conductive path between the distinct circuits. For example, galvanic isolation may be desired to protect a first IC die that operates at a relatively low supply voltage from a second IC die that operates at a relatively high supply voltage difference from the first IC die.

In order for the communication to be effective, the die must be in close proximity. However, the closer in proximity the die are, the higher the electrical fields between the die and hence the greater chance of destructive arcing. Therefore, the galvanic isolation should be sufficient to prevent destruction of the isolation between the die and to maintain sufficient high voltage isolation in order to meet safety standards.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a package integrated circuit (IC) is formed having stacked IC die which are aligned such that an inductor in one of the stacked die may communicate with an inductor in another one of the stacked die. To provide galvanic isolation between the stacked die, a preformed isolation layer is used which extends beyond the edges of the top die. In an additional aspect, a conductive ring is formed on the isolation layer, surrounding the top die, which extends partially under the top die and extends from the edges of the top die onto the isolation layer. This ring has rounded corners and does not extend to the edges of the isolation layer.

Figure 1:
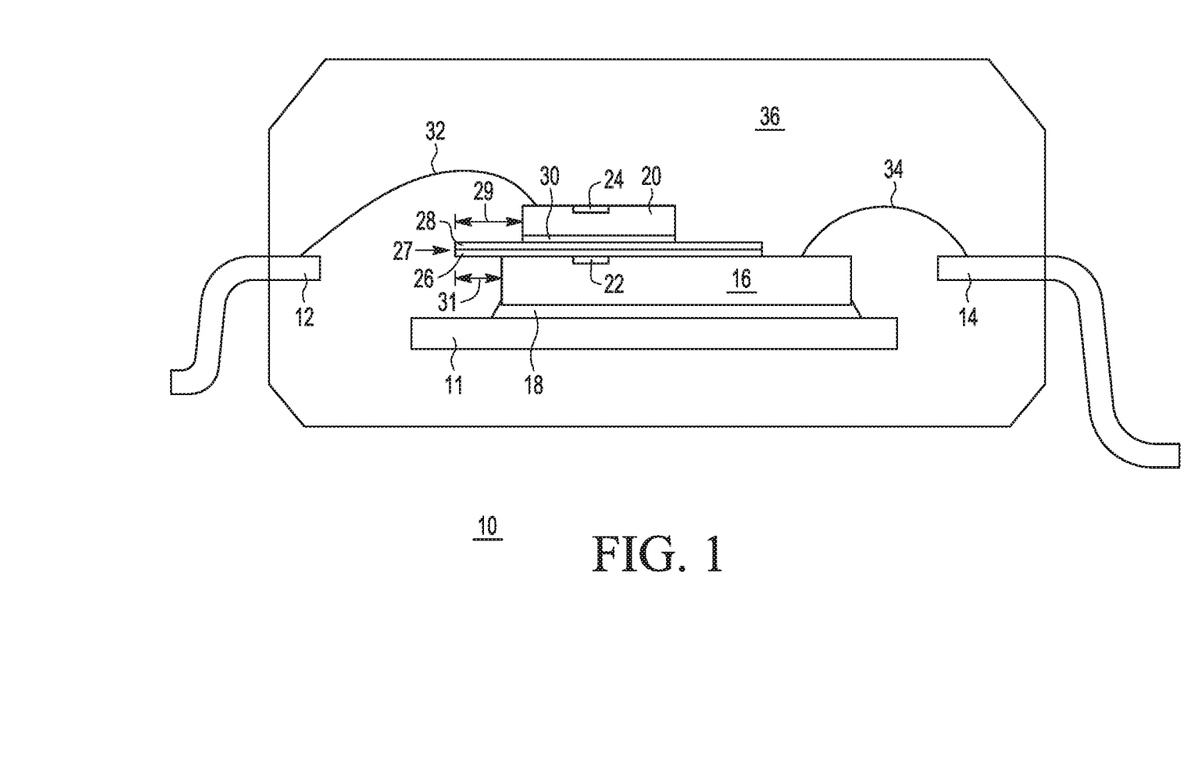
FIG. 1 illustrates a cross section of a packaged integrated circuit (IC) having stacked die in accordance with one embodiment of the present invention.

FIG. 1 illustrates a cross-section of packaged IC 10 having stacked IC die 16 and 20, in accordance with one embodiment of the present invention. When referring to the embodiment of FIG. 1, die 20 may be referred to as the top die and die 16 as the bottom die. Formation of packaged IC 10 will be described in more detail in reference to flow diagram 100 of FIG. 3.

Referring first to FIG. 1, package IC 10 includes die 16 attached to a lead frame flag portion 11 with an adhesive 18. Die 16 includes an inductor 22 formed therein. Die 16 may also include other circuitry, as needed, formed therein. Die 20 is stacked on die 16 with an isolation layer 28 (also referred to as an isolation barrier or barrier layer) located between die 20 and die 16. Die 20 includes an inductor 24 formed therein. Die 20 may also include other circuitry, as needed, formed therein. A bottom major surface of isolation layer 28 is attached to a top major surface of die 16 via an adhesive layer 26. Note that adhesive layer 26 may extend fully under isolation layer 28. A bottom major surface of die 20 is attached to a top major surface of isolation layer 28 via an adhesive layer 30. The lead frame also includes lead frame leads 12 and 14. A wire bond 32 is connected between a top major surface of die 20 and lead 12, and a wire bond 34 is connected between the top major surface of die 16 and lead 14. An encapsulant 36 completely surrounds the stacked die 16 and 20, and wire bonds 32 and 34.

Note that any number of leads may be present in the lead frame and any number of wire bonds connected the leads to die 16 or 20, but they are not visible in the cross section of FIG. 1. Also, each of inductors 22 and 24 is illustrated as being on the "active" side of each die, but each may be located at either surface of the die, or buried within the die.

Figure 2:
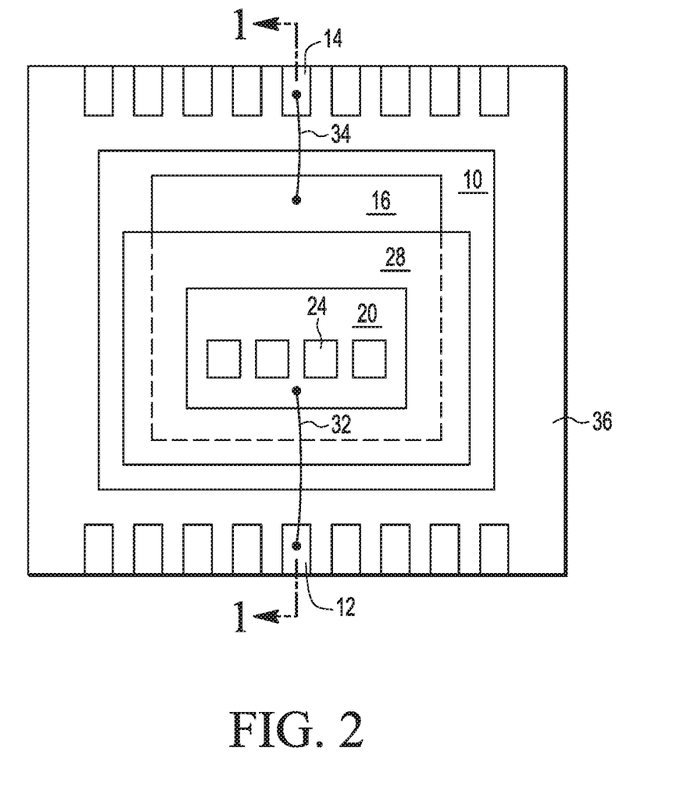
FIG. 2 illustrates a top down view of the packaged IC of FIG. 1, in accordance with one embodiment of the present invention.

FIG. 2 illustrates a top down view of packaged IC 10 of FIG. 1. Note that each die may include any number of inductors. In the illustration of FIG. 2, die 20 includes four inductors, one of which is inductor 24. Die 16 may also include any number of inductors, but they are not visible in the view of FIG. 2. In one embodiment, die 20 is coupled to receive low voltage signals from leads and die 16 is coupled to receive high voltage signals from leads, in which the high voltage is higher than the low voltage. In one embodiment, the low voltage connections are made via wire bonds to the leads on the top half of the lead frame, and the high voltage connections are made via wire bonds to leads on the bottom half of the lead frame. Also note that each lead frame lead can have more than one wire bond connection. Note that the shape and orientation of the leads of the lead frame and the shape and form of the flag portion of the lead frame may vary, as FIG. 2 illustrates a simplified lead frame.

As can be seen in FIGS. 1 and 2, isolation layer 28 extends a prespecified distance beyond the edges (or minor surfaces) of die 20. In one embodiment, this prespecified distance ensures that dielectric breakdown does not occur in encapsulant 36. For example, this distance may be 500 micrometers. In one embodiment, the prespecified distance is the same as measured from all four edges, or they can be varying or different on each side of die 20. In the illustrated embodiment, isolation layer 28 also extends beyond some of the edges (or minor surfaces) of die 16. Referring to FIG. 1, a creepage distance is defined with respect to an overhang 27 of isolation layer 28 which extends beyond the edge of die 16. This creepage distance is distance 29, in addition to the thickness of combined layers 28 and 26, and in addition to distance 31. Therefore, the creepage distance represents the wrap around distance from the edge of die 20 out around overhang 27 of isolation layer 28 and back to the edge of die 16. In one embodiment, the overhang of isolation layer 28 is such that the creepage distance is at least 100 micrometers, or preferably, 500 micrometers or more.

Referring back to FIG. 1, die 16 and die 20 are aligned such that inductor 24 may communicate with inductor 22. Therefore, each of inductor 14 and inductor 22 may be a transmitting or receiving inductor. In order to allow effective communication, inductor 24 should be in close proximity to inductor 22. Therefore, the thickness of intervening layers 26, 28, and 30, between die 16 and 20, should be minimized as well as tightly controlled. However, isolation layer 28 should have a thickness which provides galvanic isolation and protects against breakdown of isolation layer 28. That is, while the inductors communicate, isolation layer 28 provides AC and DC electrical isolation. Isolation layer 28 may include a dielectric, epoxy, bismaleimide triazine (BT), FR-4, polyimide, or a resin and may have a thickness in a range of 40-200 micrometers.

Figure 3:
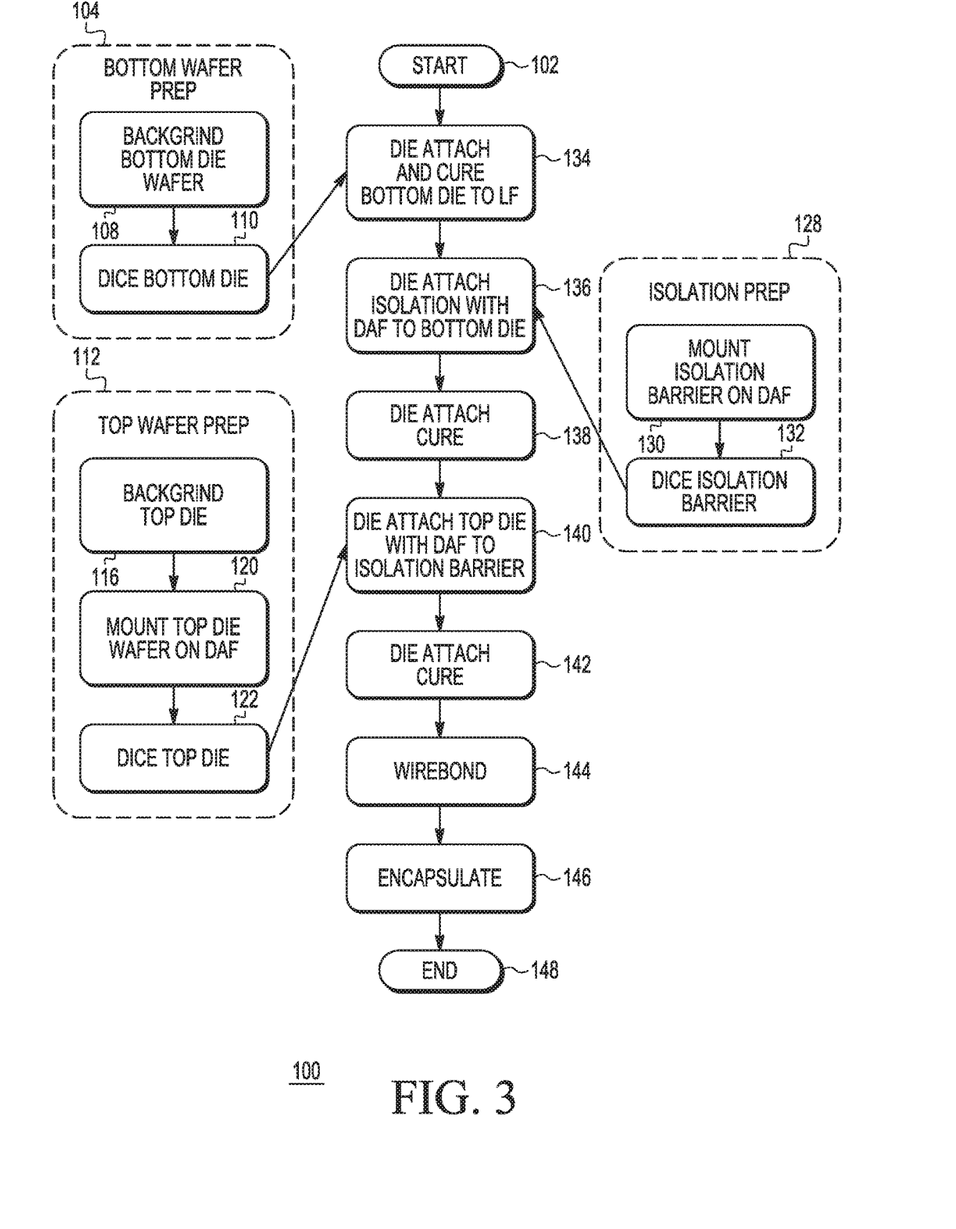
FIG. 3 illustrates, In flow diagram form, a method for forming a packaged IC with stacked die, in accordance with one embodiment of the present invention.

Further details of packaged IC 10 are provided in reference to the formation of packaged IC 10 illustrated in method 100 of FIG. 3. In block 104, the bottom die wafer (containing the bottom die) is prepared by backgrinding the bottom die wafer to a desired thickness in block 108 and dicing the bottom die wafer to singulate the die in block 110. Method 100 begins at start 102 and proceeds to block 134 in which die 16 (the bottom die) is attached to lead frame flag portion 11 using an epoxy die attach material for adhesive 18. After attaching die 16 to flag portion 11, the assembly is cured.

In block 128, an isolation layer is prepared by mounting the isolation layer onto a die attach film (DAF) in block 130 and then dicing the isolation layer mounted onto the DAF in block 132, to result in a pre-formed isolation layer. That is, the isolation layer is fully formed prior to attachment to die 16. Returning to method 100, after block 134, method 100 proceeds to block 136 in which the pre-formed isolation layer with the DAF is attached to die 16. In this embodiment, the pre-formed isolation layer is isolation layer 28 and the DAF is adhesive layer 26. Since the isolation layer is pre-formed and mounted on the DAF, the combined thickness of isolation layer 28 and adhesive layer 26 can be uniform and tightly controlled. If a gel or paste adhesive were used rather than a DAF for adhesive layer 26, the resulting thickness would be less controlled. Afterwards, the assembly of die 16 with isolation layer 28 and adhesive layer 26 is cured in block 138.

In block 112, the top die wafer (containing the top die) is prepared by backgrinding the top die wafer to a desired thickness in block 116, mounting the top die wafer to a DAF in block 120, and dicing the top die wafer with the DAF to singulate the top die in block 122. Method 100 continues after block 138 to block 140 in which the singulated top die mounted on the DAF is attached to isolation layer 28. Therefore, in this embodiment, the singulated top die is die 20 and adhesive layer 30 is the DAF that die 20 is mounted on. Similar to the DAF used for isolation layer 28, the use of a DAF for attaching die 20 to isolation layer 28 allows for the resulting thickness of layers between die 16 and die 20 to be uniform and tightly controlled. In alternate embodiments, other adhesive layers may be used which allow for a controlled thickness. Again, if a gel or paste adhesive were used, the resulting thickness may be less controlled. Note that depending on the type of adhesive used for adhesive layer 30, adhesive layer 30 may extend to the edge of isolation layer 28, or beyond. In one embodiment, a combined thickness of isolation layer 28, adhesive layer 26, and adhesive layer 30 is between 50 and 500 micrometers, or preferably, in between 50 and 200 micrometers, or preferably, between 90 and 110 micrometers.

After block 140, method 100 proceeds with block 142 in which the assembly having die 16, isolation layer 28, and die 20 is cured to cure adhesive layer 30. In an alternate embodiment, the cure of block 138 may not be performed, in which case, only the cure in block 142 would be performed to cure adhesive layers 26 and 30. After block 142, method 100 proceeds to block 144 in which wire bond connections are formed from the lead frame leads to die 16 and die 20, such as wire bonds 34 and 32. Method 100 continues with block 146 in which die 16, isolation layer 28, die 20, and the wire bonds are encapsulated with encapsulant 36. Any known techniques may be used to form the wire bonds and to encapsulate the die. Additional steps may be performed, such as trimming and forming of leads, to result in substantially completed packaged IC 10. Method 100 ends at end 148.

Note that the off-line preparation blocks, such as blocks 104, 128, and 112, can be performed before beginning method 100. Also, they can be performed in any order. Also, note that although two die are illustrated, any number of die and pre-formed isolation layers may be used, as needed. Furthermore, the pre-formed isolation layer may have various different sizes and shapes. Although the illustrated embodiment is in reference to a lead frame based package, other packages may be used which also include stacked die with intervening pre-formed isolation layers such as layer 28. For example, an isolation layer such as isolation layer 28 may be used for ball grid array (BGA) packages with organic or inorganic substrates.

Figure 4:
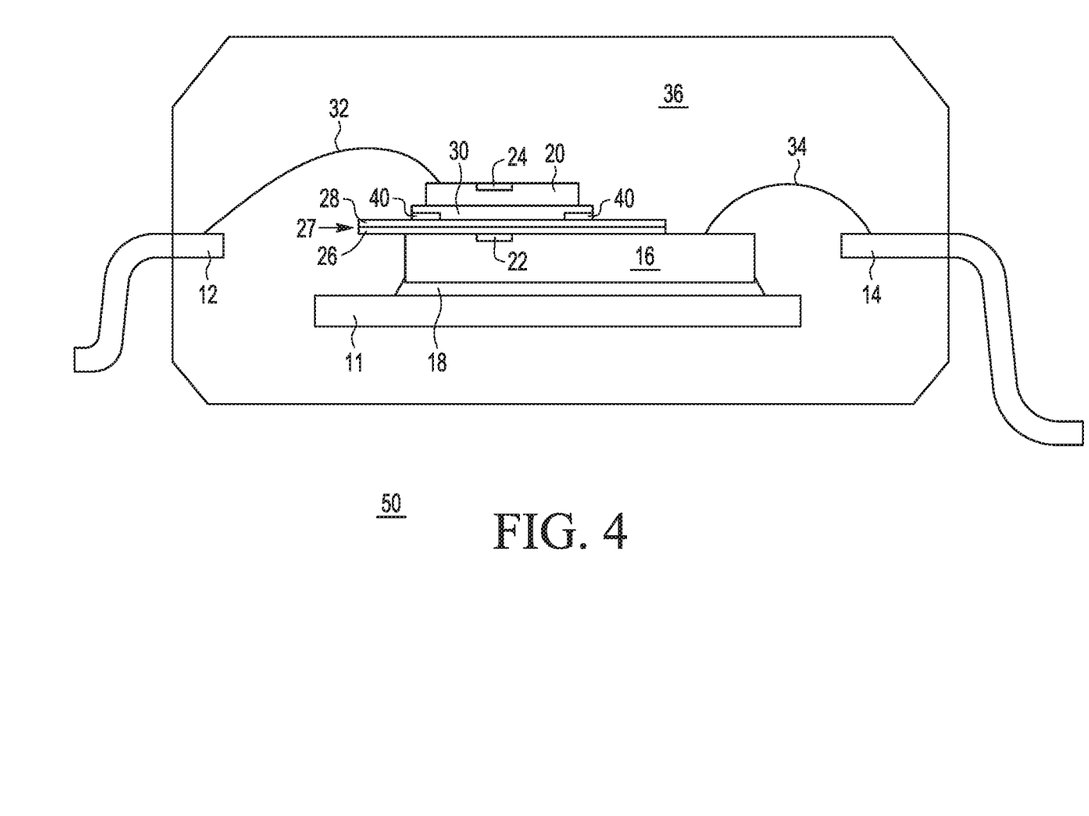
FIG. 4 illustrates a cross section of a packaged IC having stacked die in accordance with one embodiment of the present invention.
Figure 5:
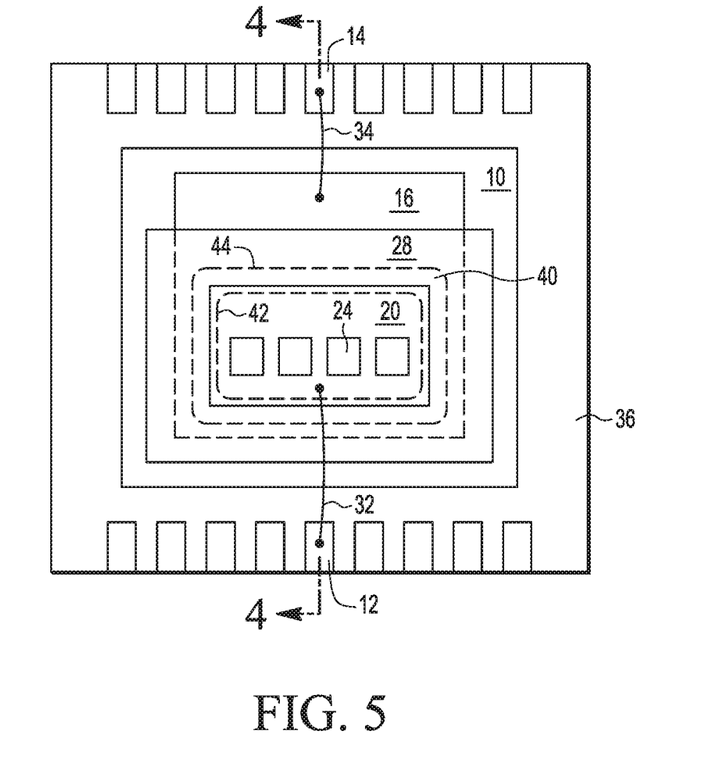
FIG. 5 illustrates a top down view of the packaged IC of FIG. 4, in accordance with one embodiment of the present invention.

FIG. 4 illustrates a cross section view of a packaged IC 50 which is similar to packaged IC 10, in which like numerals indicate like elements. However, packaged IC 50 includes a conductive ring 40 over isolation layer 28, such that it is located between adhesive layer 30 and isolation layer 28. FIG. 5 illustrates a top down view of packaged IC 50 of FIG. 4, similar to the top down view of FIG. 2, in which like numerals indicate like references, but with ring 40. As can be seen in FIG. 5, conductive ring 40 surrounds top die 20, and has an inner perimeter 42 and an outer perimeter 44. Inner perimeter 42 is located under die 20 (that is, inner perimeter 42 of ring 40 extends under die 20) and is located away from the inductors of die 20. Outer perimeter 44 of ring 40 extends a predetermined distance beyond the edges (or minor surfaces, perpendicular to adhesive 30) of die 20. In one embodiment, this predetermined distance is 100 micrometers. Conductive ring 40 may be metal, such as copper. Note that the presence of ring 40 affects the creepage distance. Rather than starting with distance 29 as seen in FIG. 1, the creepage distance is the distance from outer perimeter 44 of ring 40 to the edge of isolation layer 28, in addition to the total thickness of layers 28 and 26, and in addition to the distance back to die 16. That is, the creepage distance in the embodiment of FIGS. 4 and 5 begins at the outer edge of ring 40, rather than the outer edge of die 20, and wraps around overhang 27 of isolation layer 28 and back to the edge of die 16.

As illustrated in FIG. 5, both the inner and outer perimeters of ring 40 are rounded. This rounding of the corners of both perimeters avoids sharp shapes or corners. The size of conductive ring 40 is sufficiently big to make sure all the corners of die 20 are well within conductive ring 40. Since the electric field strength around die corners formed as a result of the dicing process is much higher than in flat areas, the insulation material (of isolation layer 28) is prone to breakdown at these corners. Therefore, having a continuous conductive ring, such as ring 40, with rounded corners reduces the electric field strength at the die corners and thus reduces the risk of a corona effect which can result in destruction of the isolation layer. In one embodiment, only the corners of the outer perimeter of ring 40 is rounded and not the corners of the inner perimeter. That is, rounding the corners of the inner perimeter may not be necessary as they do not have the high fields that the corners of the outer perimeter have. Therefore, while the corners of the inner perimeter can be rounded, the majority of the value is achieved by rounding the corners of the outer perimeter.

Referring back to method 100 of FIG. 3, to include conductive ring 40, the only change is in the preparation of the pre-formed isolation layer in block 128. In one embodiment, the insulating layer which is mounted to the DAF in block 130 comes as a core insulating material with copper clad on both sides. Therefore, for the embodiment of FIGS. 1 and 2, all of the copper, from both sides, can be etched off or removed. In the embodiment of FIGS. 4 and 5, the copper may be removed from the bottom major surface and patterned and etched on the top major surface to result in a copper ring. The bottom major surface of the insulating layer can then be mounted to the DAF and diced, such that pre-formed insulating layers are formed having a copper ring formed on the top major surface and a DAF on the bottom major surface. Therefore, this pre-formed insulating layer can be attached in block 136, such that when the pre-formed isolation layer is attached to die 16 it will have conductive ring 40 as well as adhesive layer 30.

Figure 6:
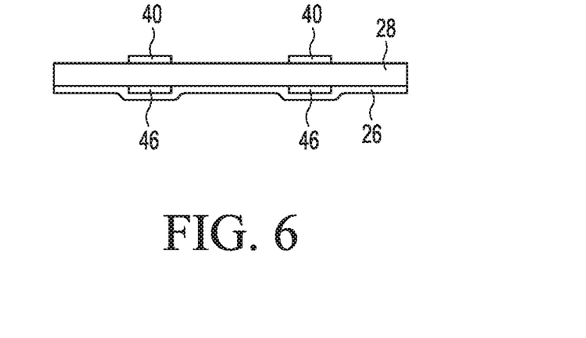
FIG. 6 illustrates a cross section of a portion of the packaged IC of FIG. 4, in accordance with an alternate embodiment of the present invention.

FIG. 6 illustrates an alternate embodiment of the pre-formed insulating layer of FIGS. 4 and 5 in which, rather than removing all the copper from the bottom major surface of the insulating layer, the bottom major surface is patterned and etched so as to result in a second conductive ring 46 on a bottom surface of the insulting layer. The insulating layer, with ring 40 on the top major surface and ring 46 on the bottom major surface is then mounted to the DAF. In this embodiment, ring 46 is between the bottom major surface of the insulating layer and the DAF. Therefore, if this pre-formed insulating layer were used in the embodiment of FIGS. 4 and 5, ring 46 would be located between insulating layer 28 and adhesive layer 26. Ring 46 may also have inner and outer perimeters, which would also include rounded corners. With ring 46, the creepage distance would be measured from the edge of ring 40, out around overhang 27 of insulating layer 28, and back to the edge of ring 46. Note that in alternate embodiments, rings 40 and 46 may have different dimensions.

In one embodiment, a thickness of each of adhesive layer 26 and adhesive layer 30 is between 50 and 200 micrometers, or between 90 and 110 micrometers. In one embodiment, the overhang of isolation layer 28 and the width of conductive ring 40, if present, results in a creepage distance of at least 100 micrometers. In one embodiment, a minimum distance between an edge of die 20 and outer perimeter 44 of conductive ring 40 is 500 micrometers.

Therefore, by now it can be appreciated that a stacked die package is provided which provides galvanic isolation between the die to allow for effective communication between inductors of each die. A pre-formed isolation layer is used to provide isolation between adjacent stacked die. The thickness of the pre-formed isolation layer, in combination with the thicknesses of adhesive layers used between the isolation layer and each of the adjacent die, can be tightly controlled to allow the inductors to remain in close proximity. Also, the pre-formed isolation layer extends beyond an edge of the top die to protect the isolation layer from damage caused by arcing electrical fields between the stacked die. In one embodiment, a conductive ring with rounded inner and outer perimeters is formed on the isolation layer, surrounding the top die located on the isolation layer. The conductive ring will reduce the electric field concentration and may help in reducing the corona effect of the electrical fields and thus reduce likelihood of damage to the isolation layer. Note that, in alternate embodiments, the inner perimeter of the conductive ring need not be rounded.

It should also be appreciated that the IC die as referenced herein may refer to any of a variety of electronic components, including but not limited to a semiconductor device, a passive device, such as a relay, a resistor, an inductor, a capacitor, a diode, a power transistor, an oscillator, and the like, or other types of electronic devices.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different packaging technologies may be used other than lead frames, and different adhesive layers may be used other than DAFs. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a packaged integrated circuit (IC) device includes a first IC die; a first inductor in the first IC die; a first layer of adhesive on a first major surface of the first IC die; an isolation layer over the first layer of adhesive; a second layer of adhesive on the isolation layer; a second IC die on the second layer of adhesive; a second inductor in the second IC die aligned to communicate with the first inductor, wherein the isolation layer extends a prespecified distance beyond a first edge of the second IC die. In one aspect of this embodiment, the IC device further includes a conductive ring beneath the second layer of adhesive extending past the first edge of the second IC die, wherein the first edge is perpendicular to the second layer of adhesive and the conductive ring. In a further aspect, the IC device further includes corners of outer perimeter of the conductive ring are rounded. In another further aspect, the conductive ring is made of copper and extends around all edges of the second IC die that are perpendicular to the second layer of adhesive and the conductive ring. In another aspect of this above embodiment, at least one of the first and second adhesive layers is a die attach film. In another aspect, the IC device further includes a lead frame flag, wherein the first die is attached to the lead frame flag; wire bonds between the first IC die and a first set of lead fingers; and wire bonds between the second IC die and a second set of lead fingers. In yet another aspect, the isolation layer includes material that is one of a group consisting of a dielectric, epoxy, bismaleimide triazine (BT), FR-4, a resin, and a polyimide material. In another aspect, thickness of the first adhesive layer, the second adhesive layer, and the isolation layer together is at least 5 micrometers. In another aspect, thickness of the first adhesive layer, the second adhesive layer, and the isolation layer together is between 90 and 500 micrometers. In another aspect, creepage distance between the first edge of the second IC die and a first edge of the insulator layer is at least 100 micrometers. In a further aspect, minimum distance between the first edge of the second IC die and a perimeter of the conductive ring extending past the first edge of the second IC die is at least 10 micrometers. In another aspect, one of the first IC die and the second IC die is coupled to a high voltage supply and the other one of the first IC die and the second IC die is coupled to a low voltage supply.

In another embodiment, a method of making a packaged integrated circuit (IC) device includes attaching a bottom side of a first IC die to a flag of a lead frame, wherein the first IC die includes a first inductor; attaching an isolation barrier to a top side of the first IC die with a first adhesive layer between the top side of the first IC die and a bottom side of the isolation barrier; attaching a second IC die to a top side of the isolation barrier with a second adhesive layer between the top side of the isolation barrier and a bottom side of the second IC die, wherein the second IC die includes a second inductor positioned to communicate signals to and from the first inductor, and the isolation barrier extends beyond a first edge of the second die a distance sufficient to be greater than or equal to a specified creepage distance. In a further aspect, the method further includes removing only a portion of a copper coating from the one side of the isolation barrier to leave a ring of conductive material on the that side of the isolation barrier, wherein an inner perimeter of the ring is outside a position of the first and second inductors and an outer perimeter of the ring is outside a perimeter of the second IC die. In a further aspect, the method further includes forming wire bonds between contacts on the first IC die and a first set of lead fingers; forming wire bonds between contacts on the second IC die and a second set of lead fingers; and encapsulating the lead frame flag, first die, isolation layer, second die and wire bonds. In another aspect, the method further includes curing the first and second adhesive layers. In another aspect, at least one of the first and second adhesive layers are die attach film. In yet another aspect, thickness of the first adhesive layer, the second adhesive layer, and the isolation layer together is at least one of the group consisting of: at least 5 micrometers and between 90 and 500 micrometers. In another aspect, the specified creepage distance is at least 100 micrometers. In a further aspect, minimum distance between the first edge of the second IC die and a perimeter of the conductive ring extending past the first edge of the second IC die is at least 5 micrometers.

What is claimed is:

1. A packaged integrated circuit (IC) device comprising:
a first IC die;
a first inductor in the first IC die;
a first layer of adhesive on a first major surface of the first IC die;
an isolation layer over the first layer of adhesive;
a second layer of adhesive on the isolation layer;
a second IC die on the second layer of adhesive, wherein a first major surface of the second IC die is in direct contact with the second layer of adhesive;
a second inductor in the second IC die aligned to communicate with the first inductor, wherein the isolation layer extends beyond a first edge of the second IC die wherein a creepage distance between the first edge of the second IC die and a first edge of the isolation layer is at least 100 micrometers; and
a lead frame flag, wherein the first die is attached to the lead frame flag;
wire bonds between the first IC die and a first set of lead fingers; and
wire bonds between the second IC die and a second set of lead fingers, wherein an end of the wire bonds between the second IC die and the second set of lead fingers are connected to a second major surface of the second die which is opposite the first major surface of the second IC die.

2. The IC device of claim 1 further comprising:
a conductive ring beneath the second layer of adhesive extending past the first edge of the second IC die, wherein the first edge is perpendicular to the second layer of adhesive and the conductive ring.

3. The IC device of claim 1 wherein:
at least one of the first and second adhesive layers is a die attach film.

4. The IC device of claim 1 wherein:
the isolation layer includes material that is one of a group consisting of a dielectric, epoxy, bismaleimide triazine (BT), FR-4, a resin, and a polyimide material.

5. The IC device of claim 2 wherein:
minimum distance between the first edge of the second IC die and a perimeter of the conductive ring extending past the first edge of the second IC die is at least 10 micrometers.

6. The IC device of claim 1 wherein:
one of the first IC die and the second IC die is coupled to a high voltage supply and the other one of the first IC die and the second IC die is coupled to a low voltage supply.

7. The IC device of claim 2 further comprising:
corners of outer perimeter of the conductive ring are rounded.

8. The IC device of claim 2 wherein:
the conductive ring is made of copper and extends around all edges of the second IC die that are perpendicular to the second layer of adhesive and the conductive ring.

9. The IC device of claim 1 wherein:
thickness of the first adhesive layer, the second adhesive layer, and the isolation layer together is at least 5 micrometers.

10. The IC device of claim 1 wherein:
thickness of the first adhesive layer, the second adhesive layer, and the isolation layer together is between 90 and 500 micrometers.

11. The IC device of claim 2, wherein the conductive ring has an inner perimeter and an outer perimeter, the inner perimeter is beneath the second IC die, and the outer perimeter extends around all four edges of the second IC die, wherein each of the four edges is perpendicular to the second adhesive layer and the conductive ring, such that all corners of the second IC die are over the conductive ring within the outer perimeter.

12. A packaged integrated circuit (IC) device comprising:
a first IC die;
a first inductor in the first IC die;
a first layer of adhesive on a first major surface of the first IC die;
an isolation layer over the first layer of adhesive;
a second layer of adhesive on the isolation layer;
a second IC die on the second layer of adhesive;
a second inductor in the second IC die aligned to communicate with the first inductor, wherein the isolation layer extends beyond a first edge of the second IC die; and
a conductive ring beneath the second layer of adhesive having an inner perimeter and an output perimeter, wherein the inner perimeter is beneath the second IC die, between the first and second IC die, and the outer perimeter extends around all four edges of the second IC die, wherein each of the four edges is perpendicular to the second adhesive layer and the conductive ring, such that all corners of the second IC die are over the conductive ring within the outer perimeter wherein a minimum distance between the first edge of the second IC die and the outer perimeter of the conductive ring extending past the first edge of the second IC die is at least 10 micrometers.

13. The IC device of claim 12 wherein:
the isolation layer includes material that is one of a group consisting of a dielectric, epoxy, bismaleimide triazine (BT), FR-4, a resin, and a polyimide material.

14. The IC device of claim 12 wherein:
creepage distance between the first edge of the second IC die and a first edge of the insulator layer is at least 100 micrometers.

15. The IC device of claim 12 wherein:
one of the first IC die and the second IC die is coupled to a high voltage supply and the other one of the first IC die and the second IC die is coupled to a low voltage supply.

16. The IC device of claim 12 wherein corners of the outer perimeter of the conductive ring are rounded.

17. The IC device of claim 12 wherein the conductive ring is made of copper.

* * * * *